United States Patent
Choi

(10) Patent No.: US 7,501,866 B2
(45) Date of Patent: Mar. 10, 2009

(54) DELAY LOCKED LOOP CIRCUIT

(75) Inventor: Hoon Choi, Kyoungki-do (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 60 days.

(21) Appl. No.: 11/477,528

(22) Filed: Jun. 30, 2006

(65) Prior Publication Data

US 2007/0069773 A1    Mar. 29, 2007

(30) Foreign Application Priority Data

Sep. 29, 2005 (KR) .................. 10-2005-0091659
Dec. 22, 2005 (KR) .................. 10-2005-0127734

(51) Int. Cl.
    *H03L 7/06* (2006.01)
(52) U.S. Cl. .................. 327/156; 327/147; 327/108
(58) Field of Classification Search .................. 327/147, 327/149, 153, 156, 158, 159, 161, 291–299; 331/17, 25; 375/373–376; 365/233
    See application file for complete search history.

(56) References Cited

U.S. PATENT DOCUMENTS

| | | | | |
|---|---|---|---|---|
| 5,485,127 | A * | 1/1996 | Bertoluzzi et al. ............. | 331/69 |
| 6,525,988 | B2 | 2/2003 | Ryu et al. .................... | 365/233 |
| 6,650,594 | B1 | 11/2003 | Lee et al. .................... | 365/233 |
| 6,754,132 | B2 * | 6/2004 | Kyung ........................ | 365/233 |
| 6,825,703 | B1 | 11/2004 | Kwak ......................... | 327/158 |
| 6,836,437 | B2 | 12/2004 | Li et al. ...................... | 365/194 |
| 2002/0000854 | A1 * | 1/2002 | Hashimoto ................... | 327/158 |
| 2004/0212406 | A1 | 10/2004 | Jung .......................... | 327/117 |
| 2005/0060487 | A1 | 3/2005 | Barth et al. .................. | 711/105 |

FOREIGN PATENT DOCUMENTS

| | | |
|---|---|---|
| JP | 11-185470 | 7/1999 |
| JP | 2005-020686 | 1/2005 |
| KR | 10-2004-0098899 A | 11/2004 |
| KR | 10-2005-0005889 A | 1/2005 |

OTHER PUBLICATIONS

Taiwanese Search Report and Office Action, w/English translation thereof, issued in Patent Application No. 095123948 dated on Aug. 21, 2008.

* cited by examiner

*Primary Examiner*—Kenneth B Wells
*Assistant Examiner*—Ryan C Jager
(74) *Attorney, Agent, or Firm*—McDermott Will & Emery LLP

(57) ABSTRACT

A synchronous memory device having a normal mode and a power down mode includes a power down mode controller for generating a power down mode control signal in response to a clock enable signal, thereby determining onset or termination of a power down mode. A clock buffering unit buffers an external clock signal in response to the power down mode control signal and outputs first and second internal clock signals. A clock selection unit selects one of the first and second internal clock signals based on the power down mode control signal to output the selected signal as an intermediate output clock signal. A phase update unit performs a phase update operation by using the intermediate output clock signal to output a delay locked loop (DLL) clock signal, the first internal clock signal differing in frequency from the second internal clock signal.

22 Claims, 8 Drawing Sheets

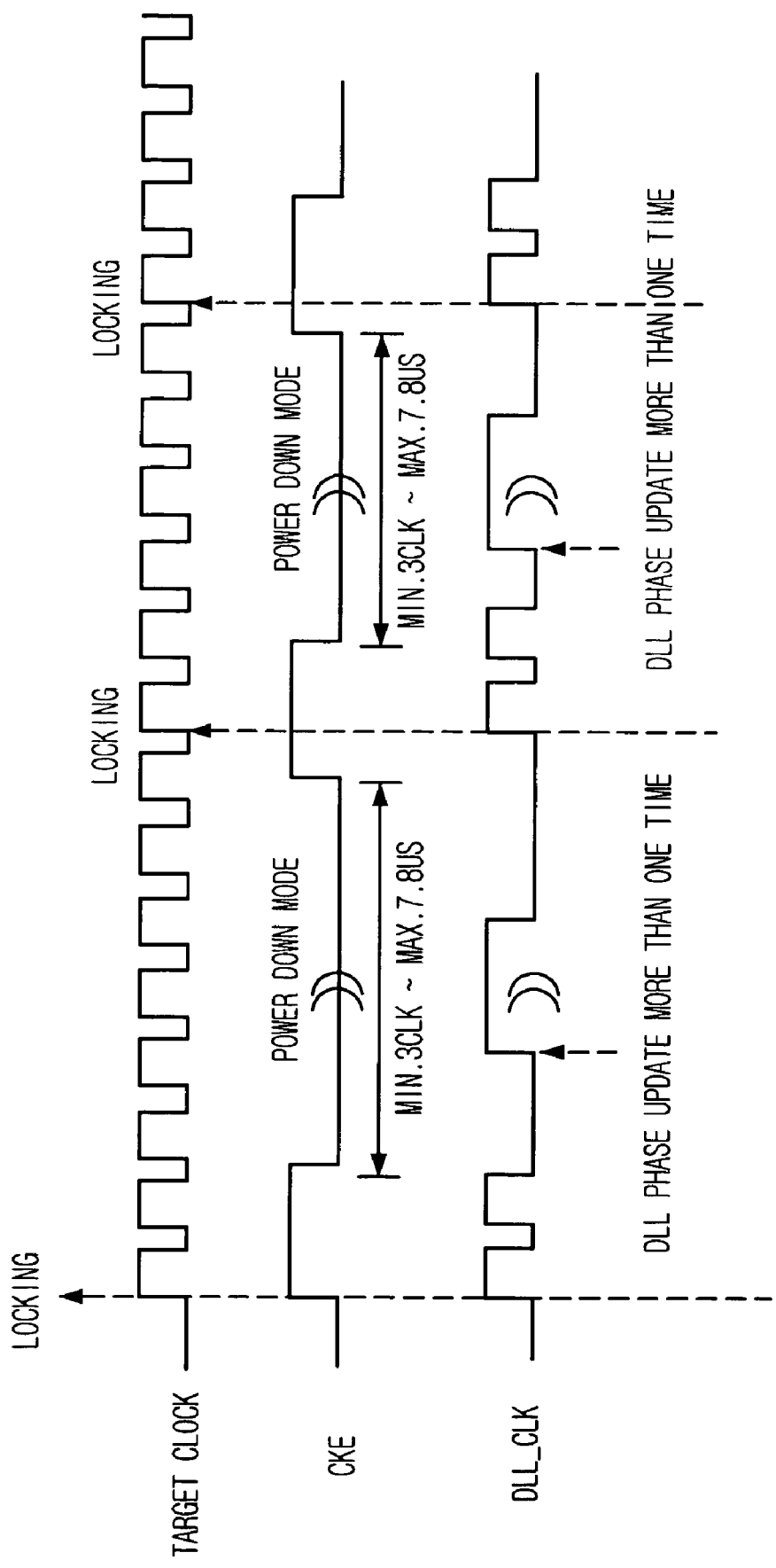

DELAY LOCKED LOOP CIRCUIT

FIELD OF THE INVENTION

The present invention relates to a delay locked loop (DLL) circuit of a synchronous DRAM; and, more particularly, to a DLL circuit for performing a stable operation in a power down mode for low power operation of a semiconductor device.

DESCRIPTION OF RELATED ARTS

A synchronous semiconductor memory device such as a double data rate synchronous DRAM (DDR SDRAM) performs data transmission with external devices using an internal clock signal locked in synchronization with an external clock signal input from an external device such as a memory controller. In order to transmit data stably, the data should be positioned accurately at an edge or a center of the clock by compensating for a delay time which occurs inevitably by the time difference between the data transmission of each element and the data being loaded into a bus.

A clock synchronous circuit that is used to compensate for delay time is a phase locked loop (PLL) or a delay locked loop (DLL). If the external clock signal is different in frequency from an internal clock signal, it is necessary to employ a frequency multiplying function. Thus, the PLL is mainly used in this case. On the contrary, if the external clock signal is equal in frequency to the internal clock signal, the DLL is used. The DLL circuit generates the internal clock signal by compensating for a clock delay component which occurs while the clock signal passing through each element is transmitted to a data output terminal within the semiconductor memory device. Accordingly, the DLL circuit enables the clock signal used for finally inputting/outputting the data to be synchronized with the external clock signal. The DLL circuit has advantages that noise is low and it can be embodied within a small area in comparison with the PLL circuit. Therefore, it is generally desirable to employ the DLL circuit as a synchronous circuit in the semiconductor memory device. Among various kinds of DLLs, recent technology provides a register controlled DLL circuit capable of reducing time which is taken in locking a first clock.

A register controlled DLL circuit having a register capable of storing a locked delay value stores the locked delay value in the register when a power is interrupted, and loads the locked delay value stored in the register when the power is turned on again so that the locked delay value is instantly used for locking the clock.

FIG. 1 is a conceptual view illustrating a basic operation of a general delay locked loop (DLL) circuit.

The DLL circuit receives an external clock signal and compensates for a delay in generation of an internal clock of the DRAM. The DLL circuit ensures that an output signal of the DRAM is in phase with the external clock signal. When the external clock and the output of the DRAM have the same phase, the data may be transferred to a chipset without error.

FIG. 2 is a block diagram a register controlled DLL circuit of the related arts.

The DLL circuit includes a clock buffer 10, a power down mode controller 20, a phase comparator 30, a delay controller 40, a delay line 50, a dummy delay line 60, and a delay replica model 70. A DLL clock signal DLL_CLK output from the DLL circuit is transferred to an output buffer 90 through a clock signal line 80 to control output timing of the data.

The clock buffer 10 generates an internal clock signal REF_CLK by receiving an external clock signal CLK and an external clock bar signal CLKB and buffering them.

The power down mode controller 20 turns off the clock buffer 10 when the DRAM enters a power down mode. For low power operation of the DRAM when there is no read/write operation, the DRAM enters the power down mode when a clock enable signal CKE becomes a logic level 'LOW'. At this time, because the clock buffer 10 does not generate the internal clock signal REF_CLK, the clock buffer 10 is turned off for saving a current state of the DLL circuit.

The phase comparator 30 detects a phase difference between input and output clocks of the DLL circuit by comparing phases of the input and output clocks with each other. Typically, in order to reduce power consumption of the DLL circuit, a frequency of an external clock input is divided into a predetermined frequency through a clock divider and then the divided clock is compared by the phase comparator 30. In FIG. 2, for the sake of illustrative convenience the clock divider is omitted. The internal clock signal REF_CLK passing through the clock buffer 10 and a feedback clock signal FB_CLK fed back after passing through an internal circuit of the DLL circuit are compared with each other at the phase comparator 30. The phase comparator 30 controls the delay controller 40 on the basis of the comparison result.

The delay controller 40 is configured with a logic circuit for determining an input path of the delay line 50 and a bi-directional shift register for shifting the direction of the path. The shift register, which receives four input signals and performs a shifting operation, has a maximum or minimum delay by making its initial input condition such that its most right signal or most left signal is in a logic level 'HIGH'. The signals inputted into the shift register have two shift right signals, and two shift left signals. For shift operation, two of the signals in a logic level 'HIGH' should not overlap each other.

The delay line 50 delays a phase of the internal clock signal REF_CLK output from the clock buffer 10. The amount of the delay is determined by the phase comparator 30. In addition, the delay line 50 determines a delay path that determines the phase delay under control of the delay controller 40. The delay line 50 includes a number of unit delay cells that are serially coupled to each other. Each of the unit delay cells includes two NAND gates that are serially coupled to each other. An input of each of the unit delay cells is connected to the shift register in the delay controller 40 in one-to-one mapping. A region where an output of the shift register becomes a logic level 'HIGH' is determined as a path through which the clock passing through the clock buffer 10 is inputted. The delay line 50 is constructed with two delay lines, one delay line for the rising clock and the other delay line for the falling clock in the DDR SDRAM, to suppress duty ratio distortion as much as possible by identically processing the rising edge and the falling edge.

The dummy delay line 60 is a delay line for generating a feedback clock signal FB_CLK applied to the phase comparator 30. The dummy delay line 60 is identical to the delay line 50 as illustrated above.

The delay replica model 70 is a circuit for modeling the delay factors that affect clock timing from input of the external clock to the chip, through delay line 50, until clock output from the chip. The accurate delay factors determine the deterioration value in the function of the DLL circuit. The delay replica model 70 is achieved by a method that a basic circuit is shrunk, simplified, or utilized as it is without any modification. Actually, the delay replica model 70 models the clock buffer, the DLL clock driver, the R/F divider, and the output buffer, as they are.

The clock signal line 80 is a path in which the DLL clock signal DLL_CLK of the DLL circuit is transferred to the output buffer 90.

The output buffer 90 receives the data from a memory core and outputs the data to a data output pad in synchronization with the DLL clock signal DLL_CLK of the DLL circuit.

FIG. 3 is a timing diagram for operation of the DLL of FIG. 2.

As shown, when entering a power down mode, the clock enable signal CKE transitions from a logic level 'HIGH' to a logic level 'LOW'. At this time, the DLL circuit stops performing a phase update operation in order to save the current state, and stores previously locked information to enter a frozen state. Herein, the term phase update operation means that the feedback clock signal FB_CLK of the DLL circuit is compared in phase with the internal clock signal REF_CLK to be determined and continuously tracked. The term frozen state means a state in which the previously locked information is stored and the phase is not updated any more.

Meanwhile, in case of a precharge power down mode, the time staying in the power down mode is in a range of minimally three clocks to maximally 7.8 µs. In this time, the clock buffer 10 is turned off by the power down mode controller 20 so as not to generate the DLL clock signal DLL_CLK of the DLL circuit.

When the power down mode is maintained for a long time, from about MIN.3CLK to MAX.7.8 µs shown in FIG. 3, during which time the phase is not updated, the current locked information of the DLL circuit may differ from the previously locked information before the power down mode due to a change in circumstance of the semiconductor device such as an external temperature.

When exiting the power down mode under such condition, i.e., the present locked information and the previously locked information do not match with each other, the phase of the DLL clock signal DLL_CLK of the DLL circuit differs from the phase of a target clock to be locked. As a result, it is difficult to accurately transmit/receive data to/from the DRAM because a phase of the external clock signal is different from that of the DLL clock signal DLL_CLK of the DLL circuit.

SUMMARY OF THE INVENTION

It is, therefore, an object of the present invention to provide a delay locked loop (DLL) circuit of a semiconductor memory device for preventing a locking failure occurring from a change in circumstance of the semiconductor device such as an external temperature during a relatively long power down mode period.

In accordance with an aspect of the present invention, there is provided a synchronous memory device having a normal mode and a power down mode, including: a power down mode controller for generating a power down mode control signal in response to a clock enable signal, thereby determining onset or termination of a power down mode; a clock buffering unit for buffering an external clock signal in response to the power down mode control signal and outputting first and second internal clock signals; a clock selection unit for selecting one of the first and second internal clock signals based on the power down mode control signal to output the selected signal as an intermediate output clock signal; and a phase update unit for performing a phase update operation by using the intermediate output clock signal to output a delay locked loop (DLL) clock signal, wherein the first internal clock signal has a different frequency from that of the second internal clock signal.

In accordance with another aspect of the present invention, there is provided a delay locked loop (DLL) including: a power down mode controller for generating a power down mode control signal in response to a clock enable signal, thereby determining onset or termination of a power down mode; a first clock buffering unit for buffering an external clock signal in response to the power down mode control signal and outputting the buffered clock signal as a first internal clock signal; a second clock buffering unit for buffering the external clock signal in response to the power down mode control signal and outputting the buffered clock signal as a second internal clock signal having a frequency lower than the first internal clock signal; a clock selection unit for outputting an intermediate output clock signal by selecting the first internal clock signal in a normal mode and the second internal clock signal in the power down mode based on the power down mode control signal; and a phase update unit for performing a phase update operation by using the intermediate output clock signal to output a delay locked loop (DLL) clock signal.

In accordance with a further aspect of the present invention, there is provided a method for generating a delay locked loop (DLL) clock of a synchronous memory device having a normal mode and a power down mode, including: generating a first internal clock signal by buffering an external clock; generating a second internal clock signal by buffering the external clock, the second internal clock having a different frequency from that of the first internal clock signal; selecting one of the first and the second internal clock signals according to a mode control signal; performing a DLL phase update operation based on the first internal clock signal in the normal mode; and performing a DLL phase update operation based on the second internal clock signal in the power down mode.

BRIEF DESCRIPTION OF THE DRAWINGS

The above and other objects and features of the present invention will become better understood with respect to the following description of the preferred embodiments given in conjunction with the accompanying drawings, in which:

FIG. 8 is a timing diagram illustrating simulation results when applying the DLL of FIG. 4 to a semiconductor memory device in accordance with an embodiment of the present invention.

DETAILED DESCRIPTION OF THE INVENTION

A delay locked loop (DLL) circuit in accordance with exemplary embodiments of the present invention will be described in detail with reference to the accompanying drawings.

Figure 1:
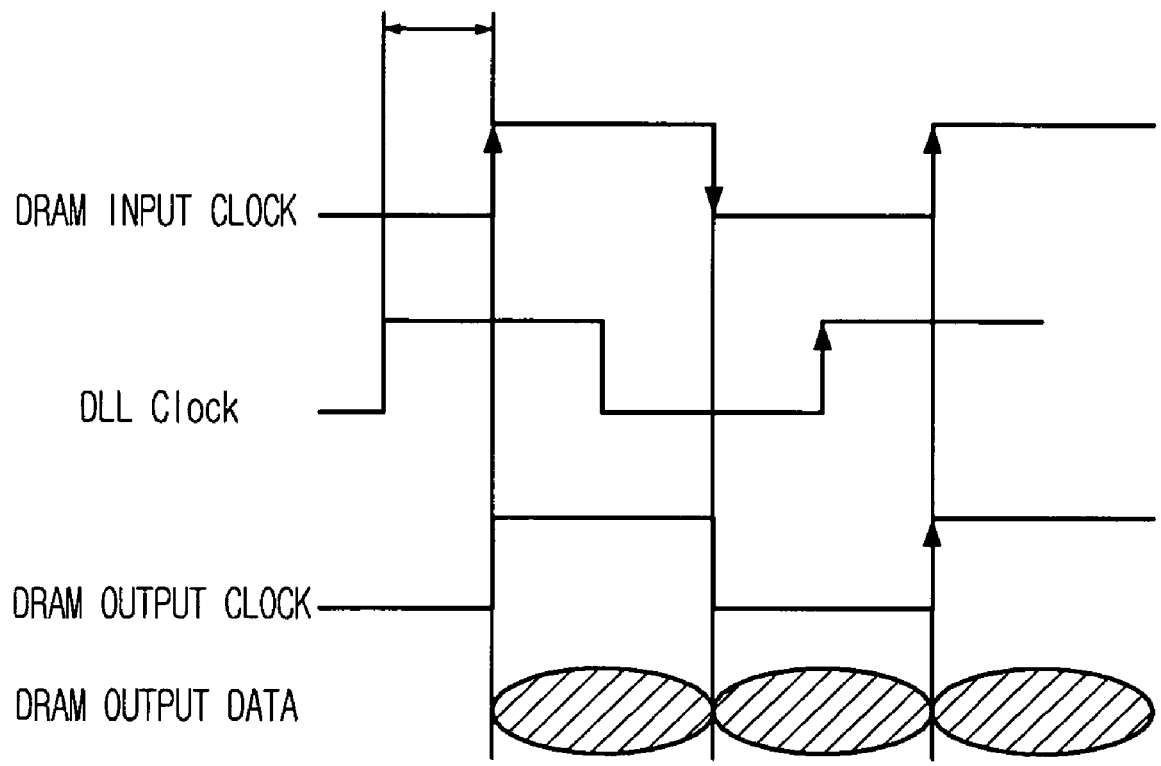
FIG. 1 is a conceptual view illustrating a basic operation of a general delay locked loop (DLL) circuit.
Figure 2:
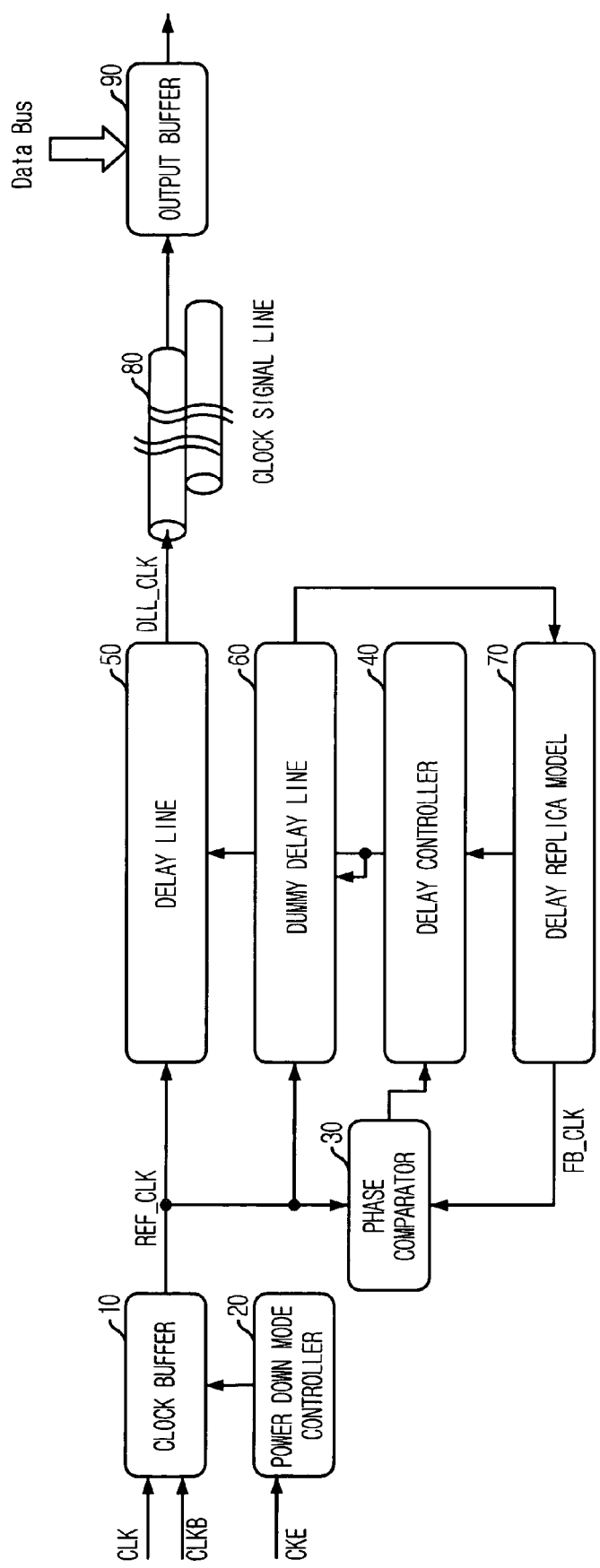
FIG. 2 is a block diagram of a DLL circuit.
Figure 3:
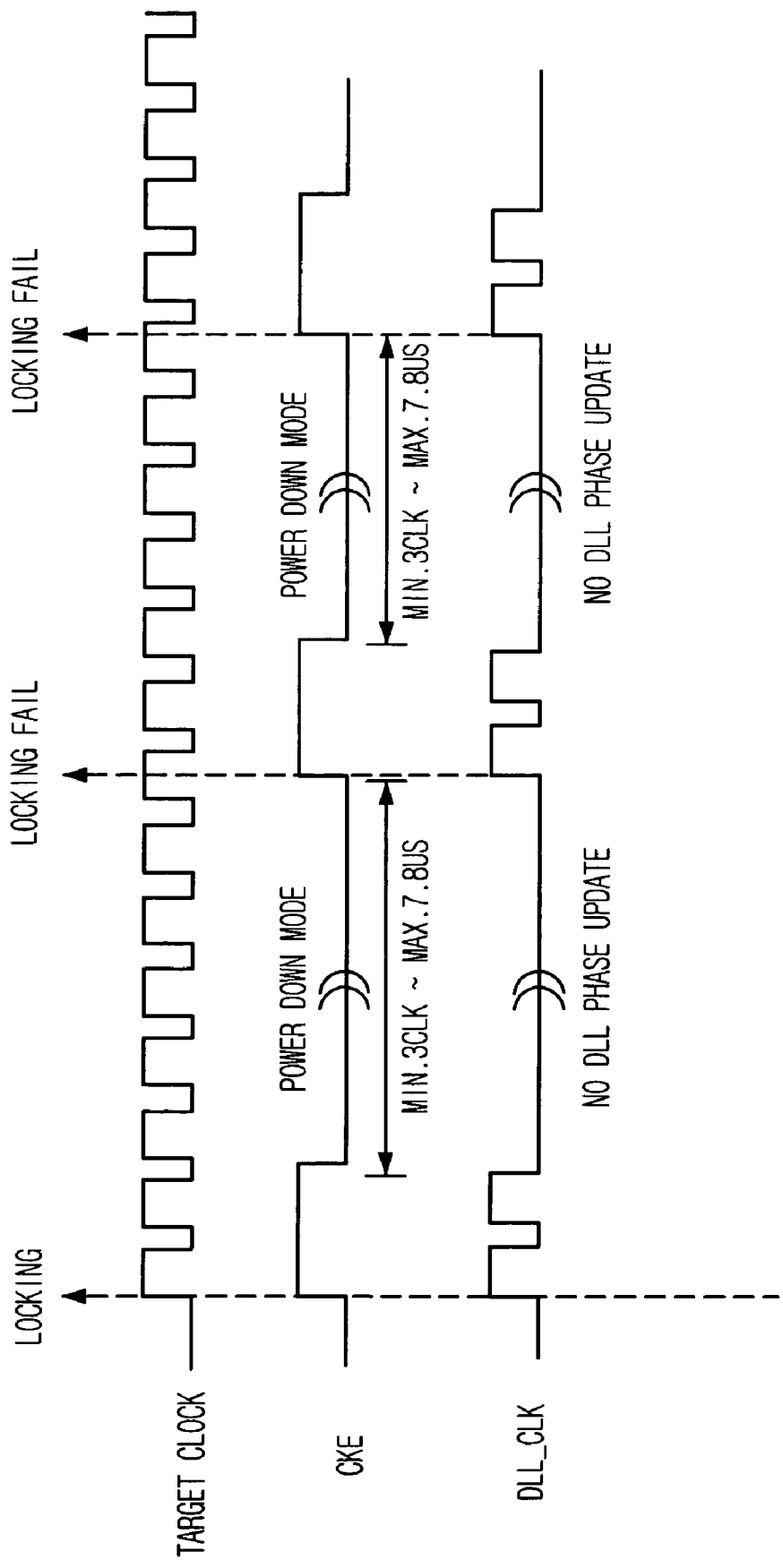
FIG. 3 is a timing diagram for operation of the DLL of FIG. 2.
Figure 4:
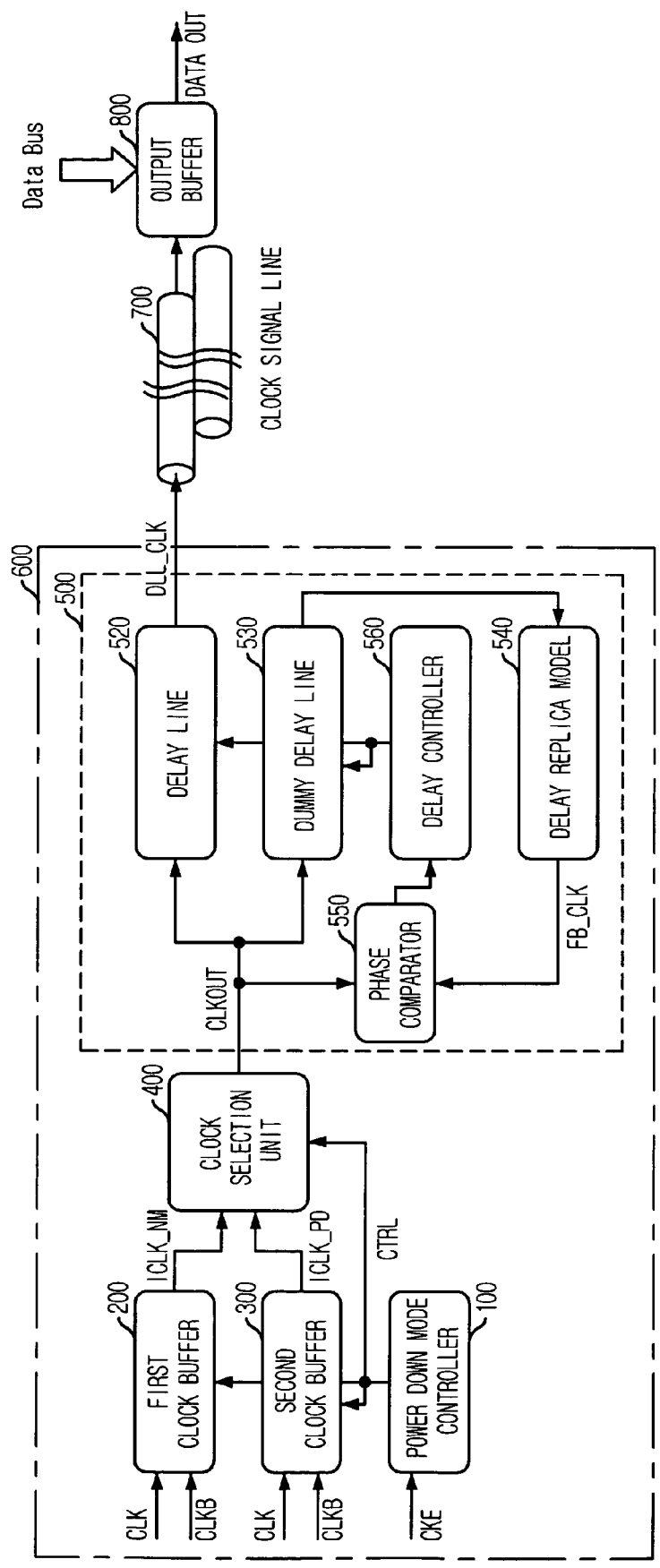
FIG. 4 is a block diagram of a DLL circuit in accordance with an embodiment of the present invention.

FIG. 4 is a block diagram of a DLL circuit in accordance with an embodiment of the present invention.

The DLL circuit 600 includes a power down mode controller 100, a first and a second clock buffer 200 and 300, a clock selection unit 400, and a phase update unit 500.

The power down mode controller 100 generates a power down mode control signal CTRL which determines onset or termination of a power down mode in response to a clock enable signal CKE.

The first clock buffer 200 receives and buffers an external clock signal CLK and an external clock bar signal CLKB in response to the power down mode control signal CTRL, to output the buffered signal as a first internal clock signal ICLK_NM.

The second clock buffer 300 receives and buffers the external clock signal CLK and the external clock bar signal CLKB in response to the power down mode control signal CTRL, to output the buffered signal as a second internal clock signal ICLK_PD. The second internal clock signal ICLK_PD has a frequency lower than the first internal clock signal ICLK_NM.

The clock selection unit 400 outputs an intermediate output clock signal CLKOUT by selecting one of the first internal clock signal ICLK_NM and the second internal clock signal ICLK_PD based on the power down mode control signal CTRL. In case of a normal mode, the first internal clock signal ICLK_NM is selected; in case of the power down mode, the second internal clock signal ICLK_PD is selected.

The phase update unit 500 performs a phase update operation to output a DLL clock signal DLL_CLK using the selected clock signal by the clock selection unit 400.

The phase update unit 500 is a register controlled DLL that includes a delay line 520, a dummy delay line 530, a delay replica model 540, a phase comparator 550 and a delay controller 560.

The delay line 520 receives the intermediate output clock signal CLKOUT of the clock selection unit 400 to delay a phase of the intermediate output clock signal CLKOUT by a predetermined time. The dummy delay line 530 is substantially identical to the delay line 520. The delay replica model 540 outputs a feedback clock signal FB_CLK by modeling an output signal of the dummy delay line 530 with delay factors of the external clock signal CLK and the external clock bar signal CLKB in a semiconductor memory device. The phase comparator 550 detects a phase difference between the intermediate output clock signal CLKOUT of the clock selection unit 400 and the feedback clock signal FB_CLK of the delay replica model 540. The delay controller 560 controls the delay line 520 and the dummy delay line 530 on the basis of an output signal of the phase comparator 550.

The DLL clock signal DLL_CLK of the DLL circuit 600 is transferred to an output buffer 800 through a clock signal line 700 to control an output timing of the data.

The DLL circuit 600 includes the first clock buffer 200 which operates in the normal mode and the second clock buffer 300 which operates in the power down mode. In addition, the DLL circuit 600 includes the second clock buffer 300 whose frequency is lower than that of the first clock buffer 200. Accordingly, in the normal mode, the DLL circuit 600 performs the phase update operation by using the first internal clock signal ICLK_NM of the first clock buffer 200, and in the power down mode, the DLL circuit 600 performs the phase update operation by using the second internal clock signal ICLK_PD of the second clock buffer 300.

Therefore, in the DLL circuit 600 of the present invention, the clock selection unit 400 is controlled by the power down mode controller 100 based on the power down mode control signal CTRL. The phase update unit 500 performs the phase update operation in response to the intermediate output clock signal CLKOUT outputted from the clock selection unit 400, which selects one of the first internal clock signal ICLK_NM and the second internal clock signal ICLK_PD.

For that reason, the DLL circuit of the present invention performs at least one phase update operation in the power down mode based on the second internal clock signal ICLK_PD in comparison with the DLL circuit of the related arts which does not perform a phase update operation in the power down mode.

Figure 5:
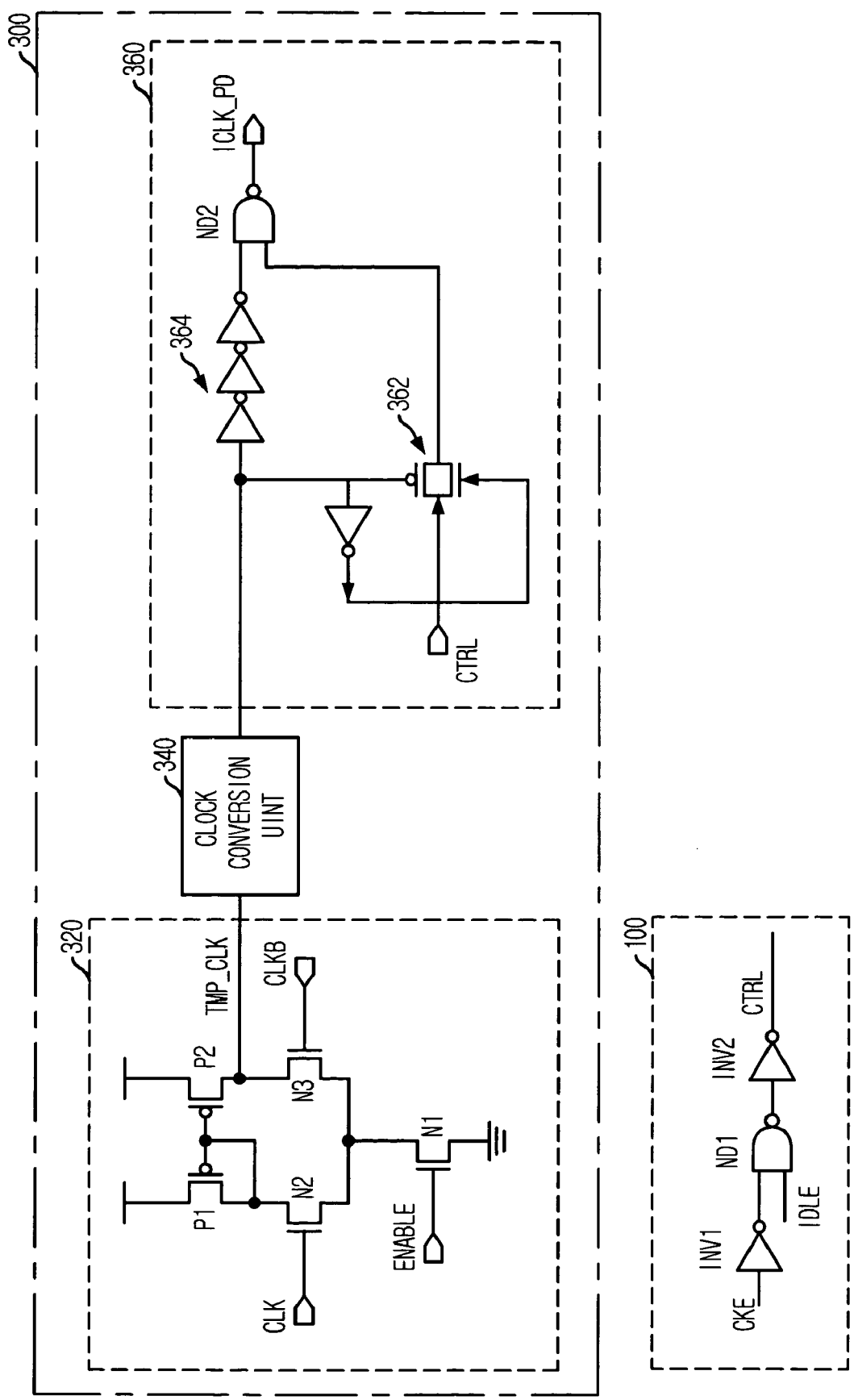
FIG. 5 is a detailed circuit diagram of a power down mode controller and a second clock buffer shown in FIG. 4.

FIG. 5 is a detailed circuit diagram of the power down mode controller 100 and the second clock buffer 300 shown in FIG. 4.

The power down mode controller 100 includes a first and a second inverter INV1 and INV2, and a first NAND gate NAND1.

The first inverter INV1 inverts the clock enable signal CKE; the first NAND gate NAND1 performs a NAND operation of an output signal of the first inverter INV1 and an idle signal IDLE of which is opposite in phase to that of the clock enable signal CKE in the power down mode. The second inverter INV2 inverts an output signal of the first NAND gate NAND1 to output the inverted signal as the power down mode control signal CTRL. In the power down mode, the clock enable signal CKE has a logic level 'LOW' and the idle signal IDLE has a logic level 'HIGH'.

The second clock buffer 300 includes a differential amplifier 320, a clock conversion unit 340, and an output unit 360.

The differential amplifier 320 compares the external clock signal CLK with the external clock bar signal CLKB to amplify the compared result; the clock conversion unit 340 performs a frequency transformation of an output signal of the differential amplifier 320. The output unit 360 outputs an output signal of the clock conversion unit 340 as the second internal clock signal ICLK_PD in response to the power down mode control signal CTRL.

The differential amplifier 320 of the second clock buffer 300 includes an enable NMOS transistor N1, input NMOS transistors N2 and N3, and output PMOS transistors P1 and P2.

The enable NMOS transistor N1 controls an operation of the differential amplifier 320 in response to an enable signal ENABLE. The input NMOS transistors N2 and N3 control an output signal of the differential amplifier 320, i.e., a temporary clock signal TMP_CLK, in response to the external clock signal CLK and the external clock bar signal CLKB. The output PMOS transistors P1 and P2 are connected between a source voltage and a node of the temporary clock signal TMP_CLK for determining the temporary clock signal TMP_CLK according to the input NMOS transistors N2 and N3.

The second clock buffer 300 includes the clock conversion unit 340 between the differential amplifier 320 and the output unit 360 in comparison with the first clock buffer 200. The clock conversion unit 340 may include at least one clock divider connected in series.

The output unit 360 includes a transfer gate 362, a third inverter 364, and a second NAND gate ND2.

The transfer gate 362 transfers the power down mode control signal CTRL in response to an output signal of the clock conversion unit 340. The third inverter 364 includes a plurality of inverters connected in series to delay the output signal of the clock conversion unit 340, with inversion, by a predetermined time. The second NAND gate ND2 performs a NAND operation of the power down mode control signal CTRL transferred by the transfer gate 362 and an output signal of the third inverter 364 to output the NAND-operated signal as the second internal clock signal ICLK_PD.

Figure 6:
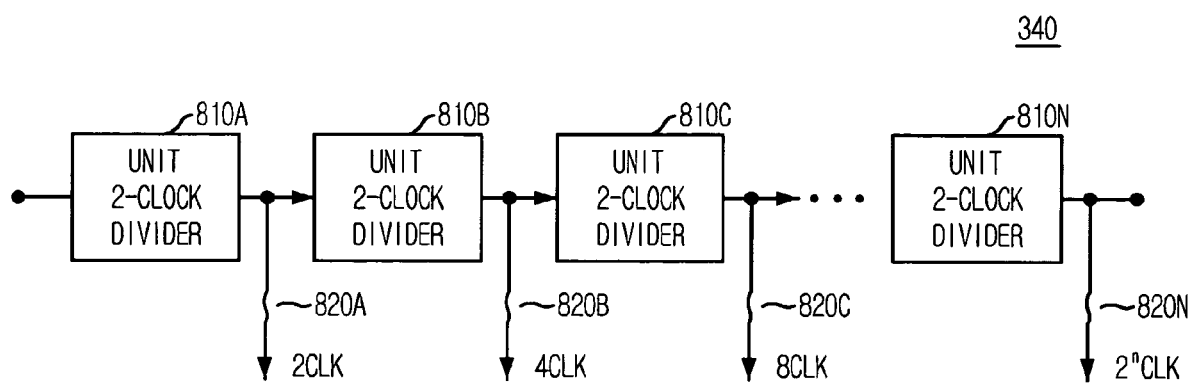
FIG. 6 is a detailed circuit diagram of a clock conversion unit shown in FIG. 5.
Figure 7:
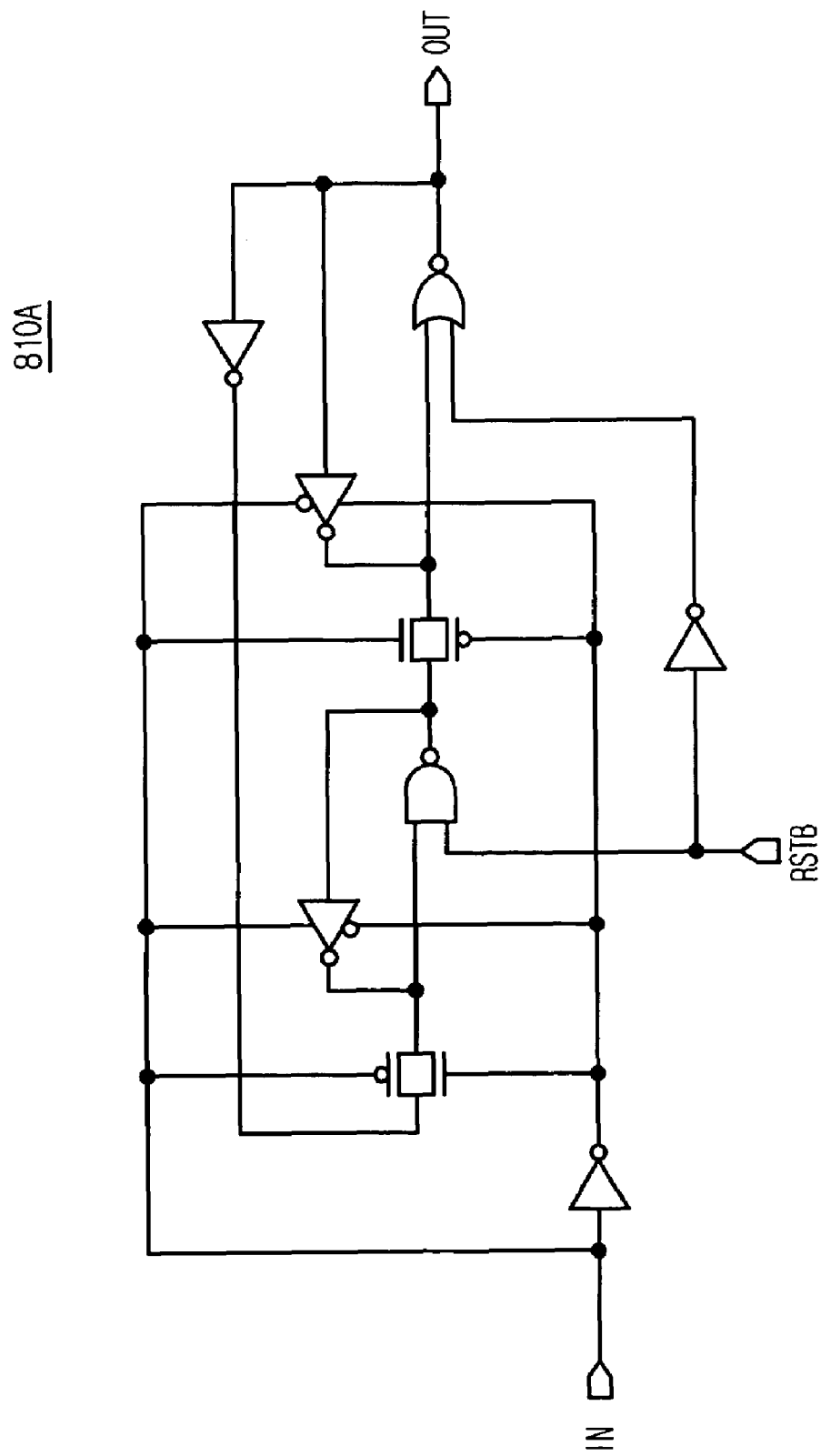
FIG. 7 is a detailed circuit diagram of a 2-clock divider shown in FIG. 6.

FIG. 6 is a detailed circuit diagram of the clock conversion unit 340 shown in FIG. 5, and FIG. 7 is a detailed circuit diagram of a unit 2-clock divider 810A shown in FIG. 6.

Referring to FIG. 6, the clock conversion unit 340 of the present invention includes a plurality of unit 2-clock dividers 810A to 810N, and a plurality of fuse units 820A to 820N.

The plurality of unit 2-clock dividers 810A to 810N are connected in series to generate a plurality of clocks having different clock units, e.g., 2-clock to $2^n$ clock; and the plurality of fuse units 810A to 810N select one of the output clocks of the plural unit 2-clock dividers by blowing a selected fuse.

A unit 2-clock divider 810A among the unit 2-clock dividers 810A to 810N is shown as an exemplary structure in FIG. 7. The unit 2-clock divider 810A generates an output clock OUT by dividing an input clock IN into 2.

Accordingly, the clock conversion unit 340 of the present invention is used as a 2-clock divider, a 4-clock divider composed of two unit 2-clock dividers in series, or a $2^n$-clock divider composed of n numbers of the unit 2-clock dividers in series. As a result, in the power down mode, the clock conversion unit 340 may set a desired clock according to a desired range of the phase update operation by using the plurality of the 2-clock dividers.

That is, in the present invention, the clock conversion unit 340 is implemented so as to generate a plurality of divided clocks, and one of the plural divided clocks is selected for use by testing. Alternatively, it is possible to use a metal option process unit instead of the plural fuse units 820A to 820N.

FIG. 8 is a timing diagram illustrating simulation results when applying the DLL circuit of FIG. 4 to a semiconductor memory device in accordance with an embodiment of the present invention.

As shown, in accordance with the embodiment of the present invention, in case of a precharge power down mode, even through the power down mode is maintained for a long time such as 7.8 us, a DLL phase update operation is performed, at least one more time, by the second internal clock signal ICLK_PD of the second clock buffer 300 for the power down mode.

Therefore, it is possible to prevent a locking failure in which previous locking information differs from present locking information resulting from a change in a circumstance of the semiconductor device, such as a variation of external temperature during long a power down mode period.

As above described, in accordance with the present invention, even through the semiconductor memory device stays in the power down mode for a long time, the DLL locking failure is effectively prevented by performing the DLL phase update operation more than one time. As a result, the DLL circuit operates more stably.

The present application contains subject matter related to the Korean patent application Nos. KR 2005-91659 & 2005-127734, filed in the Korean Patent Office on Sep. 29, 2005 & Dec. 22, 2005, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device, comprising:
    a clock buffering unit for buffering an external clock signal in response to the power down mode control signal having an information of a power down mode to output first and second internal clock signals;
    a clock selection unit for selecting one of the first and second internal clock signals based on the power down mode control signal to output the selected signal as an intermediate output clock signal; and
    a phase update unit for performing a phase update operation by using the intermediate output clock signal to output a delay locked loop (DLL) clock signal,
    wherein the intermediate output clock signal has a different frequency according to an operating mode.

2. The semiconductor memory device as recited in claim 1, wherein the clock selection unit outputs the first internal clock signal in a normal mode and the second internal clock signal in the power down mode based on the power down mode control signal.

3. The semiconductor memory device as recited in claim 1, wherein the clock buffering unit includes:
    a first clock buffer for buffering the external clock signal in response to the power down mode control signal, thereby outputting the buffered clock signal as the first internal clock signal; and
    a second clock buffer for buffering the external clock signal in response to the power down mode control signal, thereby outputting the buffered clock signal as the second internal clock signal having a lower frequency than the first internal clock signal.

4. The semiconductor memory device as recited in claim 3, wherein the second clock buffer includes:
    a differential amplifier for comparing the external clock signal with an inverted external clock signal to amplify the compared result;
    a clock conversion unit for performing a frequency transformation of an output signal of the differential amplifier; and
    an output unit for outputting the second internal clock signal based on the power down mode control signal and an output signal of the clock conversion unit.

5. The semiconductor memory device as recited in claim 4, wherein the clock conversion unit includes a clock divider.

6. The semiconductor memory device as recited in claim 4, wherein the clock conversion unit includes:
    a plurality of unit 2-clock dividers connected in series for generating a plurality of clocks, each of which has a different unit clock; and
    a plurality of fuse units for selecting one of clocks outputted from the plurality of unit 2-clock dividers by blowing a selected fuse among the plurality of fuses.

7. The semiconductor memory device as recited in claim 4, wherein the clock conversion unit includes:
    a plurality of unit 2-clock dividers connected in series for generating a plurality of clocks, each of which has a different unit clock; and
    a plurality of option process units for selecting one of clocks outputted from the plurality of unit 2-clock dividers by a metal option process unit.

8. The semiconductor memory device as recited in claim 4, wherein the output unit includes:

a transfer gate for transferring the power down mode control signal in response to an output of the clock conversion unit;
an odd number of inverters connected in series, for delaying the output of the clock conversion unit by a predetermined time, by inverting, to output an inverted delay signal; and
a NAND gate for performing a logic NAND operation of the inverted delay signal and the power down mode control signal transferred by the transfer gate, thereby outputting the second internal clock signal.

9. The semiconductor memory device as recited in claim 1, further comprising a power down mode controller for generating the power down mode control signal in response to a clock enable signal, thereby determining onset or termination of the power down mode.

10. The semiconductor memory device as recited in claim 9, wherein the power down mode controller includes:
a first inverter for inverting the clock enable signal;
a NAND gate for performing a NAND operation of an output signal of the first inverter and an idle signal opposite in phase to the clock enable signal in the power down mode; and
a second inverter for inverting an output signal of the NAND gate and outputting the inverted signal as the power down mode control signal.

11. The semiconductor memory device as recited in claim 9, wherein the phase update unit includes:
a delay line for delaying a phase of the intermediate output clock signal and outputting a delayed intermediate output clock signal;
a dummy delay line having a constitution which is substantially the same as that of the delay line;
a delay replica model for modeling an output signal of the dummy delay line as delay factors of a clock signal in the semiconductor memory device and outputting a feedback clock signal;
a phase comparator for comparing the intermediate output clock signal with the feedback clock signal to detect a phase difference therebetween; and
a delay controller for receiving an output signal of the phase comparator to control phase delays of the delay line and the dummy delay line, thereby outputting the DLL clock signal.

12. A delayed locked loop (DLL), comprising:
a first clock buffering unit for buffering an external clock signal in response to the power down mode control signal having a power down mode and outputting the buffered clock signal as a first internal clock signal;
a second clock buffering unit for buffering the external clock signal in response to the power down mode control signal and outputting the buffered clock signal as a second internal clock signal having a frequency lower than the first internal clock signal;
a clock selection unit for outputting an intermediate output clock signal by selecting the first internal clock signal in a normal mode and the second internal clock signal in the power down mode based on the power down mode control signal; and
a phase update unit for performing a phase update operation by using the intermediate output clock signal to output a delay locked loop (DLL) clock signal.

13. The DLL as recited in claim 12, wherein the second clock buffering unit includes:
a differential amplifier for comparing the external clock signal with an inverted external clock signal to amplify the compared result;
a clock conversion unit for performing a frequency transformation of an output signal of the differential amplifier; and
an output unit for outputting the second internal clock signal in response to the power down mode control signal and an output signal of the clock conversion unit.

14. The DLL as recited in claim 13, wherein the clock conversion unit includes a clock divider.

15. The DLL as recited in claim 13, wherein the clock conversion unit includes:
a plurality of unit 2-clock dividers connected in series for generating a plurality of clocks, each of which has a different unit clock; and
a plurality of fuse units for selecting one of the clocks output from the plurality of unit 2-clock dividers by blowing a selected fuse among the plurality of fuses.

16. The DLL as recited in claim 13, wherein the output unit includes:
a transfer gate for transferring the power down mode control signal in response to an output of the clock conversion unit;
an odd number of inverters connected in series, for delaying the output of the clock conversion unit by a predetermined time, with inverting, to output an inverted delay signal; and
a NAND gate for performing a logic NAND operation of the inverted delay signal and the power down mode control signal transferred by the transfer gate, thereby outputting the second internal clock signal.

17. The DLL as recited in claim 12, further comprising a power down mode controller for generating the power down mode control signal in response to a clock enable signal, thereby determining onset or termination of the power down mode.

18. The DLL as recited in claim 17, wherein the power down mode controller includes:
a first inverter for inverting the clock enable signal;
a NAND gate for performing a NAND operation of an output signal of the first inverter and an idle signal opposite in phase to that of the clock enable signal in the power down mode; and
a second inverter for inverting an output signal of the NAND gate and outputting the inverted signal as the power down mode control signal.

19. The DLL as recited in claim 12, wherein the phase update unit includes:
a delay line for delaying a phase of the intermediate output clock signal and outputting a delayed intermediate output clock signal;
a dummy delay line having a constitution which is substantially the same as that of the delay line;
a delay replica model for modeling an output signal of the dummy delay line as delay factors of a clock signal in a semiconductor memory device and outputting a feedback clock signal;
a phase comparator for receiving the intermediate output clock signal and the feedback clock signal to detect a phase difference therebetween; and
a delay controller for receiving an output signal of the phase comparator to control phase delays of the delay line and the dummy delay line, thereby outputting the DLL clock signal.

20. A method for generating a delay locked loop (DLL) clock of a semiconductor memory device having a normal mode and a power down mode, comprising:
generating a first internal clock signal by buffering an external clock;

generating a second internal clock signal by buffering the external clock, the second internal clock having a different frequency from that of the first internal clock signal;
selecting one of the first and the second internal clock signals according to a mode control signal;
performing a DLL phase update operation based on the first internal clock signal in the normal mode; and
performing a DLL phase update operation based on the second internal clock signal in the power down mode.

21. The method as recited in claim 20, wherein the second internal clock signal has a lower frequency than the first internal clock signal.

22. The method as recited in claim 20, wherein the mode control signal includes information showing whether the memory device is in the normal mode or in the power down mode.

* * * * *